(12) United States Patent
Kuji et al.

(10) Patent No.: US 6,727,026 B2
(45) Date of Patent: Apr. 27, 2004

(54) SEMICONDUCTOR INTEGRATED CIRCUIT PATTERNS

(75) Inventors: Tatsuaki Kuji, Kanagawa-ken (JP); Koji Hashimoto, Kanagawa-ken (JP); Satoshi Usui, Kanagawa-ken (JP); Shigeki Nojima, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 10 days.

(21) Appl. No.: 09/815,004

(22) Filed: Mar. 23, 2001

(65) Prior Publication Data
US 2001/0024758 A1 Sep. 27, 2001

(30) Foreign Application Priority Data

Mar. 24, 2000 (JP) .................................. P2000-085244
Mar. 21, 2001 (JP) .................................. P2001-081140

(51) Int. Cl.$^7$ .............................. G03F 9/00; G03C 5/00
(52) U.S. Cl. .............................. 430/5; 430/30; 430/311
(58) Field of Search ................................ 430/5, 30, 311

(56) References Cited

U.S. PATENT DOCUMENTS

| 5,817,437 | A |   | 10/1998 | Ahn et al. ...................... 430/5 |
| 5,817,439 | A | * | 10/1998 | Tzu et al. ....................... 430/5 |
| 6,022,644 | A | * | 2/2000  | Lin et al. ........................ 430/5 |
| 6,355,503 | B2 | * | 3/2002 | Schroeder .................... 438/116 |

FOREIGN PATENT DOCUMENTS

JP        11-102060        4/1999

\* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

In a method of designing patterns of a semiconductor integrated circuit, the shape of each of a plurality of opening patterns formed by a plurality of contact holes is formed into a rectangular shape; and the contact holes are arranged in such a manner that a long side of each of the rectangular opening patterns is opposite to a long side of an adjacent rectangular opening pattern, and the positions of both ends of the long sides are trued up. Furthermore, a photomask is used for manufacturing a semiconductor integrated circuit as designed by the above method of designing patterns of a semiconductor integrated circuit, in which a plurality of rectangular opening patterns are provided thereon as a plurality of rectangular opening patterns for contact holes; and the a plurality of rectangular opening patterns are arranged in such a manner that adjacent long sides thereof are opposite to each other, and the position of both ends of each long side is trued up. Besides, a semiconductor device comprises a semiconductor integrated circuit designed by using a method of designing a semiconductor integrated circuit.

14 Claims, 9 Drawing Sheets

| FIRST OPENING PATTERN (OBJECTIVE PATTERN) | | SECOND OPENING PATTERN (ADJACENT PATTERN) | | ARRANGEMENT OF PATTERNS P1:OBJECTIVE PATTERN P2:ADJACENT PATTERN | | SPACE BETWEEN PATTERNS (MS) |
|---|---|---|---|---|---|---|
| PATTERN SHAPE | SIDE | PATTERN SHAPE | SIDE | | | |
| RECTANGLE | LONG SIDE | RECTANGLE | LONG SIDE | P1 P2 (MS) | P1 P2 | f / 2.5f |
| | | | SHORT SIDE | | | 2.5f |
| | | SQUARE | — | | | 2.5f |
| | SHORT SIDE | RECTANGLE | SHORT SIDE | | | 2.5f |
| | | SQUARE | — | | | 2.5f |
| SQUARE | — | SQUARE | — | | | 2f |

| SPACE(S) | CORRECTION DATA FOR SHORT SIDE | CORRECTION DATA FOR LONG SIDE |
|---|---|---|
| f≦S<s1 | (W2-f)/2 | A |
| s1≦S<s2 | (W1-f)/2 | B |
| s2≦S | 0 | 0 |

FIG.9A

DISTRIBUTION OF EXPOSURE LIGHT INTENSITY

FIG.9B

DISTRIBUTION OF EXPOSURE LIGHT INTENSITY

SEMICONDUCTOR INTEGRATED CIRCUIT PATTERNS

CROSS REFERENCE TO RELATED APPLICATION

This application claims benefits of priority under 35 USC § 119 to Japanese Patent Applications No. 2000-085244, filed on Mar. 24, 2000 and No. 2001-081140, filed on Mar. 21, 2001, the entire contents of which are incorporated by reference herein.

BACKGROUND OF THE INVENTION

1. Field of the Invention

The present invention relates to a method of designing semiconductor integrated circuit patterns; a photomask as used when a semiconductor integrated circuit is manufactured; and a method of manufacturing the semiconductor integrated circuit.

2. Description of the Related Art

With a high integration or high accelerating of a semiconductor device, the scale-down of a pattern is accelerated. In particular, with respect to a pattern for a contact/through hole (which is hereinafter shortened to read "a contact hole") as formed in an interlayer dielectric, the diameter of a contact hole has a tendency to be scaled down, while the length between a contact hole and an adjacent one thereto also has a tendency to be shortened.

If the length between contact holes is shortened, it is commonly possible to densely arrange a pattern of contact hole. However, when the length between contact holes is uniformly shortened, an exposure margin is decreased; that is, in a photolithography process, a mask pattern is decreased in definition by light diffraction.

Therefore, recently, as a manner for improving a mask pattern in definition, a phase shift mask has been largely used. In particular, a half-tone type of phase shift mask attracts attention, wherein no auxiliary pattern is required, and a method of producing the mask is relatively simple. This half-tone type of phase shift mask is a photomask which comprises an opening and a translucent light shielding area, wherein a phase difference of 180° between a transmitted light at the shielding area and a transmitted light at the opening is provided.

Hereupon, as the shape of an opening pattern for a contact hole which is formed on a photomask, a square is usually utilized. A contact hole may be independently formed; however, a plurality of contact holes is often arranged in the form of a line. Even if a half-tone type of phase shift mask is used, when opening patterns for such contact holes that are arranged in the form of a line are transferred on a wafer, as explained hereinafter, a problem of a deformation of the transferred patterns due to a side lobe will be caused.

Figure 9A:
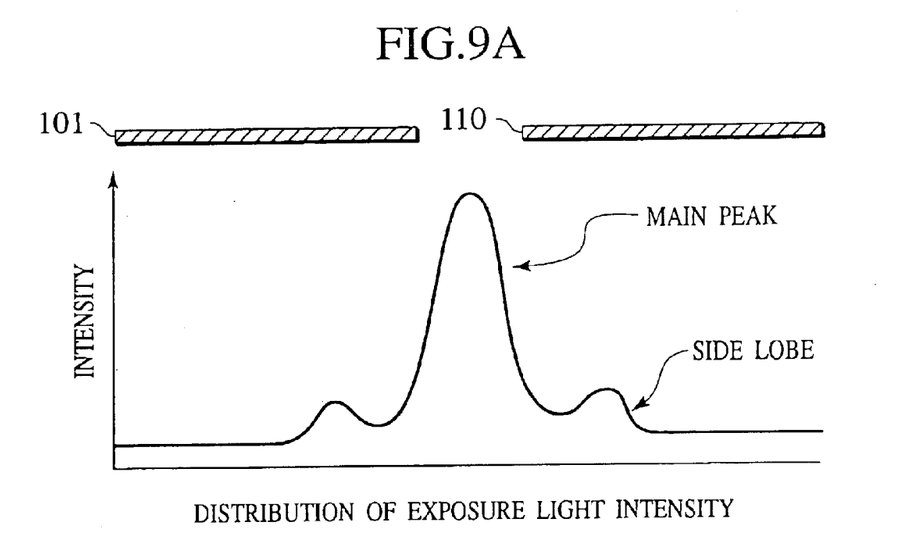
FIG. 9A is a graph that shows a photomask having an opening pattern for a conventional contact hole; and an intensity distribution of exposure light as transferred on a resist through this opening pattern.

FIG. 9A is a drawing illustrating an intensity distribution of an exposure light which passes through a photomask (101) which is a half-tone type of phase shift mask having a single square opening (110). At the center of the opening (110), a main lobe of the exposure light is formed, and a side lobe is formed also outside the opening. Incidentally, from the viewpoint of a plane, the main lobe and the side lobe are formed on a concentric circle. Therefore, when the light intensity of the side lobe is strong, a pattern of the side lobe may be transferred on a resist. Then, it becomes difficult to form a desirable designed pattern on a wafer.

The light intensity of the side lobe depends upon conditions for exposure, a type of a resist, a mask bias or the like. Therefore, by finding an optimum condition of each of them, the problem that a side lobe pattern is transferred on a resist on a wafer is commonly avoided, and thus a desirable pattern can be transferred on the wafer.

Figure 9B:
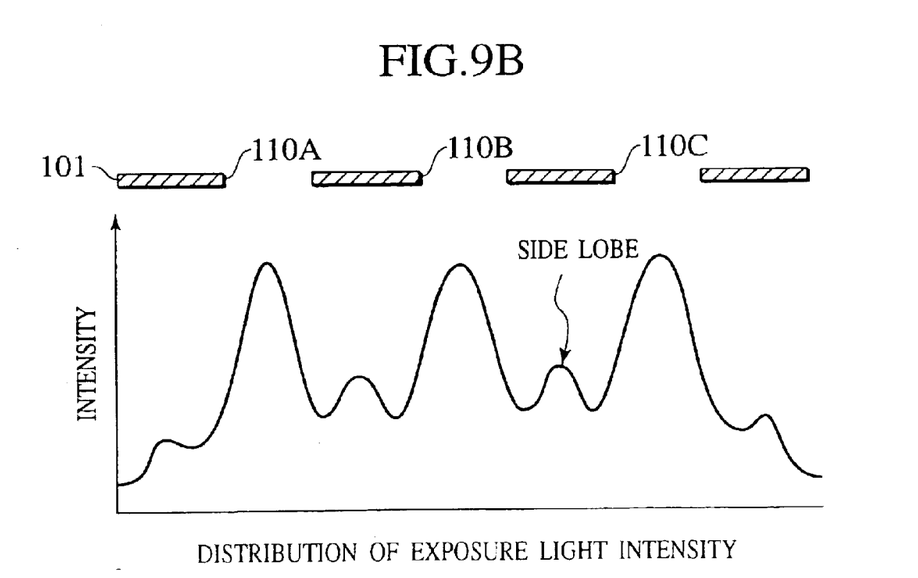
FIG. 9B is a graph which shows a photomask having an opening pattern for a conventional plural contact holes; and an intensity distribution of exposure light as transferred on a resist through this opening pattern.

However, as shown in FIG. 9B, when a plurality of square openings (110A to 110C) are closely arranged in the form of a line on a photomask (101), a side lobe as formed around each opening overlaps others, and thus the peak intensity of the side lobes is increased. In this case, it becomes very difficult to avoid a side lobe pattern as transferred on a wafer.

Accordingly, conventionally, when a plurality of contact holes is formed, it was necessary to make each space between patterns of contact holes on a wafer long to a certain length or more. Therefore, due to the limitation of the position of contact holes, the scale down of patterns has been impeded.

On the other hand, when rectangular opening patterns are formed on a photomask, the side lobe intensity is smaller as compared with the one when square opening patterns are formed. However, when a plurality of patterns are closely arranged, the problem that transferred patterns are deformed by an Optical Proximity Effect cannot be ignored, which is not limited to square or rectangular patterns.

Figure 10A:
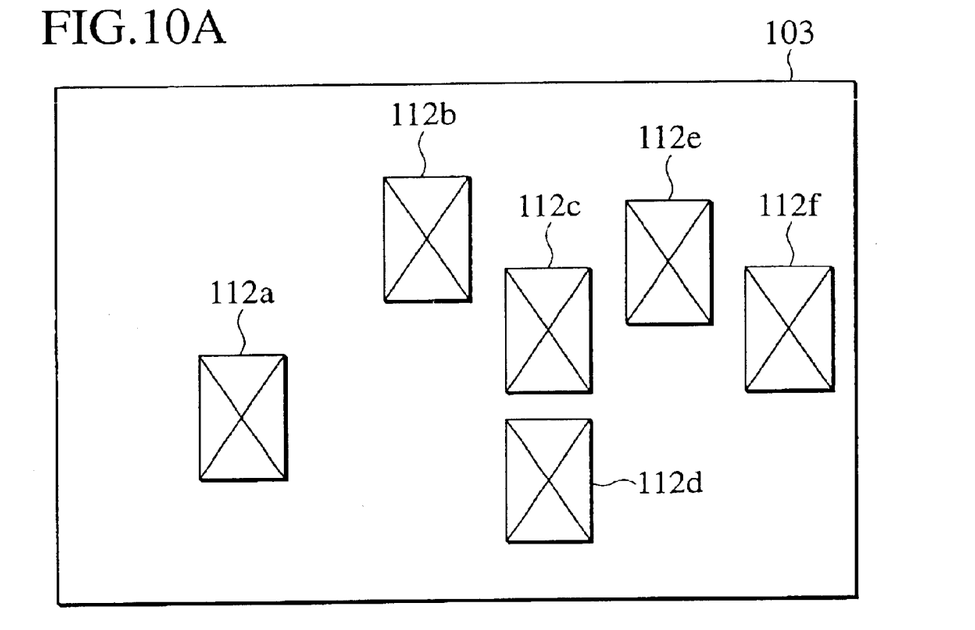
FIG. 10A illustrates an example of a plurality of rectangular opening patterns as formed on a conventional photomask.
Figure 10B:
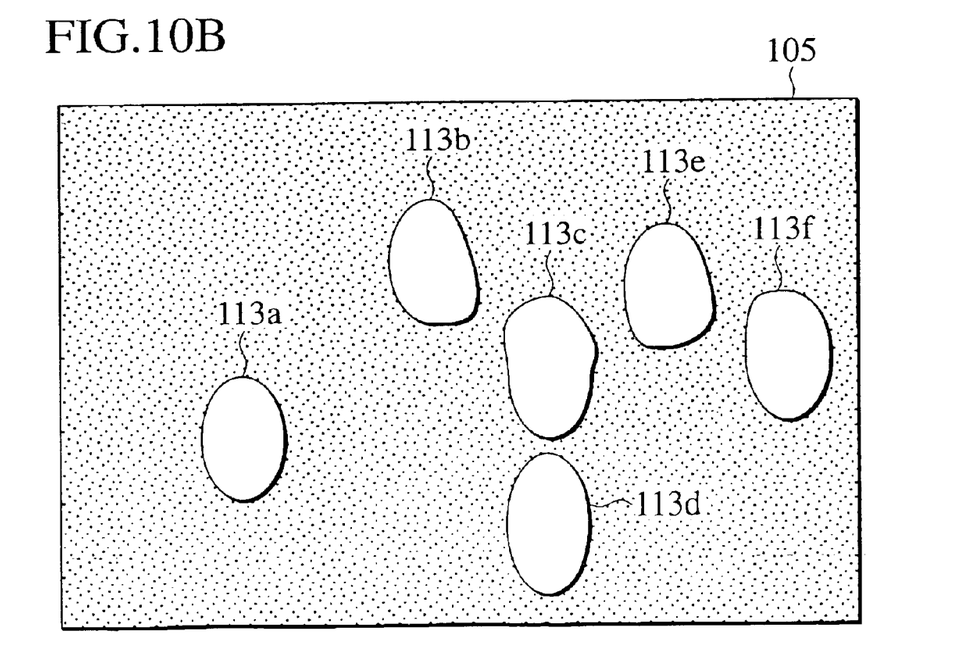
FIG. 10B illustrates transferred patterns on the resist, which were provided according to a photolithography process in which the photomask of FIG. 9A is used, wherein the patterns are deformed by Optical Proximity Effect.

For example, as shown in FIG. 10A, when a photomask (103) on which a plurality of fine rectangular patterns (112a to 112f) are formed is used so as to carry out a photolithography process, patterns (113a to 113f) as deformed by an Optical Proximity Effect are transferred on a resist (105) on a wafer, as shown in FIG. 10B. In particular, when a space between rectangular patterns which are adjacent to each other is narrow, and the position of the upper end or the lower end of each side of the rectangular patterns is not trued up (for example, 112b to 112f), a deformation of transferred patterns by an Optical Proximity Effect is remarkable and complicated (for example, 113b to 113f).

Conventionally, for such a deformation caused by an Optical Proximity Effect, this deformation is previously taken into consideration, and an OPC (Optical Proximity Correction) processing by which a correction is added to a pattern on a mask has been carried out. However, an OPC processing for a plurality of patterns in which the position of the upper end or the lower end is not trued up, as shown in FIG. 10A, is complicated, and it is actually impossible to completely carry out a correction.

SUMMARY OF THE INVENTION

It is an object of the present invention to provide a method of designing patterns of a semiconductor integrated circuit, which is suitable for reducing a deformation of transferred patterns due to an exposure process and for forming patterns in accordance with a design.

It is another object of the present invention to provide a photomask that is suitable for precisely transferring designed patterns on a wafer.

It is a further object of the present invention to provide a semiconductor device as designed by using the above method of designing patterns of a semiconductor integrated circuit.

A first aspect of the present invention provides a method of designing patterns of a semiconductor integrated circuit which is characterized in that shape of each of a plurality of opening patterns corresponding to a plurality of contact holes is formed into a rectangular shape; and the contact holes are arranged in such a manner that a long side of each of the rectangular opening patterns is opposite to a long side of an adjacent rectangular opening pattern, and the position of ends of the long sides is trued up.

According to the first aspect of the present invention, rectangular opening patterns are formed on a mask that is used for forming patterns provided by the method. When the rectangular opening patterns are used, the intensity of a side lobe of an exposure light is weak, and thus a deformation of transferred patterns due to the side lobe can be reduced. Furthermore, a plurality of rectangular patterns are arranged in such a manner that both ends of a long side of each of them are trued up, and thus a precise Optical Proximity Effect correction can be relatively easily applied to a photomask pattern. Therefore, provided that an Optical Proximity Effect correction can be carried out, a design space between patterns can be made narrower. Accordingly, designed patterns can be precisely transferred on a wafer, and a circuit area can be reduced.

A second aspect of the present invention provides a method of designing patterns of a semiconductor integrated circuit which is characterized in that when a plurality of contact holes having rectangular or square opening patterns are present together, a space (DS) between adjacent patterns is decided on the basis of the shape of patterns, and the arrangement conditions of an adjacent pattern to an objective pattern. That is, in such an area that the positions of both ends of a side of an adjacent opening pattern are not trued up, each space (DS) between the opening patterns is made to be such a length (DD2) that when the opening patterns corresponding thereto are formed on a photomask, no deformation of transferred patterns as formed by using the opening patterns is caused by a side lobe of an exposure light and/or by an Optical Proximity Effect; while in such an area that long sides of the opening patterns are adjacent to be opposite to each other, and the positions of both ends are trued up, each space (DS) between the opening patterns is made shorter than such a length (DD1) that when the opening patterns corresponding thereto are formed on a photomask, an Optical Proximity Effect is not caused to transferred patterns as prepared by using the opening patterns.

According to the second aspect of the present invention, on the photomask as used for forming the patterns, patterns in which no deformation is caused by a side lobe and/or an Optical Proximity Effect, and patterns which can be corrected by an OPC processing can be formed. As a result, designed patterns can be precisely formed on a wafer.

A third aspect of the present invention provides a photomask for using for manufacturing a semiconductor device having a semiconductor integrated circuit as designed by the above-mentioned method of designing patterns of a semiconductor integrated circuit, wherein a plurality of rectangular opening patterns for contact holes are provided thereon. It is further wherein the a plurality of rectangular opening patterns are arranged in such a manner that long sides thereof are opposite to each other, and the positions of both ends of each long side are trued up. Incidentally, an Optical Proximity Effect correction may be applied to the rectangular opening patterns.

According to the third aspect of the present invention, a deformation of transferred patterns due to a side lobe can be restrained. Furthermore, when the position of both ends of a long side of each rectangular opening pattern is trued up, an Optical Proximity Effect correction can be relatively easily applied thereto so as to precisely transfer designed patterns on a wafer.

A fourth aspect of the present invention provides a photomask for using for manufacturing a semiconductor device having a semiconductor integrated circuit as designed by the above-mentioned method of designing patterns of a semiconductor integrated circuit, wherein the photomask comprises: a plurality of rectangular or square opening patterns in which the positions of both ends of side of an adjacent rectangular or square opening pattern are not trued up, and each space (MS) between the opening patterns is made to be such a length (MD2) that no deformation of a transferred pattern is caused by a side lobe due to an exposure light and/or by an Optical Proximity Effect; and a plurality of rectangular opening patterns in which long sides thereof are adjacent to each other and opposite to each other, and the positions of both ends of long sides which are adjacent to each other are trued up, and each space (MS) between the opening patterns is made shorter than such a length (D1) that no Optical Proximity Effect is caused, and to which an Optical Proximity Effect correction is applied.

According to the fourth aspect of the present invention, in an area in which patterns to which it is difficult to apply an Optical Proximity Effect correction are arranged, such a space between the patterns that no deformation of transferred patterns is caused by a side lobe and/or an Optical Proximity Effect is ensured, while in an area in which patterns to which it is possible to apply an Optical Proximity Effect correction are arranged, an Optical Proximity Effect correction is carried out, and thus transferred patterns in accordance with designed patterns can be formed on a wafer.

A fifth aspect of the present invention provides a semiconductor device designed by using the above-mentioned method of designing a semiconductor integrated circuit, and thus a photomask of the present invention as mentioned above is used therein, and patterns in accordance with designed values are provided therefor.

DETAILED DESCRIPTION OF THE EMBODIMENTS (First Embodiment)

Figure 1:
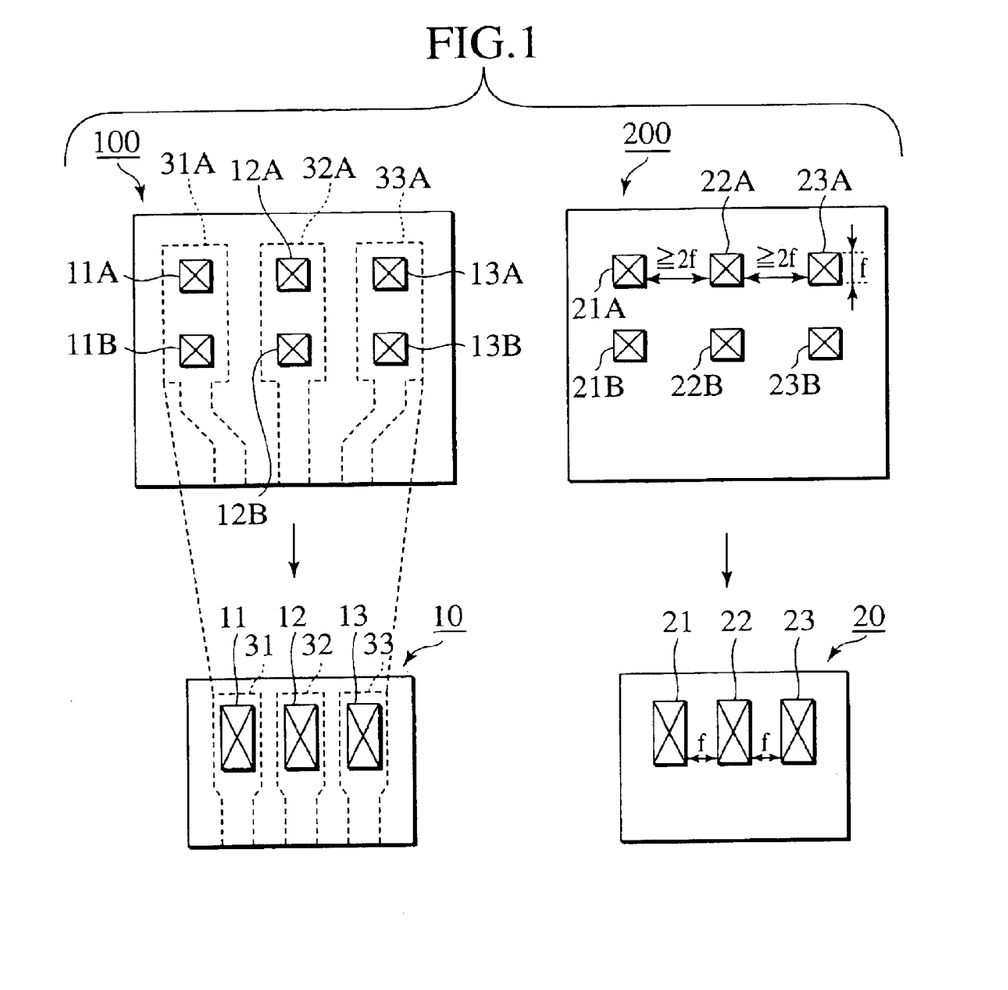
FIG. 1 shows a circuit design pattern illustrating a method of designing a contact hole pattern according to a first embodiment of the present invention, and patterns on a photomask corresponding thereto.

FIG. 1 shows a method of designing a pattern according to a first embodiment of the present invention. The lower drawings of FIG. 1 illustrate a designed circuit pattern (10) according to the first embodiment of the present invention; and a pattern (20) on a photomask corresponding to the designed circuit pattern. Furthermore, in order to provide a clear comprehension of a method of designing the pattern according to the first embodiment of the present invention, the upper drawings of FIG. 1 illustrates a conventional designed circuit pattern (100); and a conventional pattern (200) on a photomask corresponding to the designed circuit pattern (100). In order to simplify an explanation therefor, hereupon, the length of one side of a regular square and the length of a short side of a rectangle are represented by the symbol "f", while the length of a long side of the rectangle is represented by the symbol "2f".

As a photomask as used hereupon, which is not particularly limited, a half-tone type of phase shift photomask is preferably used, wherein a masked shielding area having a transmittance of 3% to 20% is used.

In a semiconductor integrated circuit, it is often necessary to form a plurality of contact holes on the same layer. For example, when a plurality of transistors are formed, a plurality of contact holes are formed so as to electrically connect each of gate electrodes to a plurality of wires on the upper layer. In these cases, according to a conventional designed circuit pattern, a plurality of contact holes are often formed on each of gate electrodes so as to more surely carry out an electrical connection. For example, in the designed circuit pattern (100), contact holes (11A and 11B) are formed on a gate electrode (31A), contact holes (12A and 12B) are formed on a gate electrode (32A), and contact holes (13A and 13B) are formed on a gate electrode (33A). Two contact holes as formed on the same gate electrode will be connected to the same wire, and thus the potential thereof will be electrically identical with each other.

As the result, in conventional designed circuit patterns, the patterns of square contact holes are positioned in such a manner that a plurality of the patterns come close to each other from the upper side to the lower side and from right to left. Furthermore, in order to form the contact hole patterns, opening patterns (21A, 21B, 22A, 22B, 23A 23B) corresponding thereto are similarly formed on a photomask pattern (200) also.

As mentioned above, when a photomask on which a plurality of square opening patterns are arranged in vicinity to each other is used so as to carry out photolithography, a specific length or more, for example, hereupon "2f" or more is provided for each contact hole opening pattern space on the photomask so as to avoid the deformation of a transferred pattern on a resist, which is caused by a side lobe as shown in FIG. 9B. Accordingly, even in case of the designed pattern (100), each space between contact holes is determined taking conditions for the exposure step into consideration. Therefore, a gate electrode width between gate electrodes (31A to 33A) in the conventional designed circuit pattern (100) is widened at an area at which contact holes are formed.

On the other hand, the method of designing a pattern according to the first embodiment of the present invention is intended to replace the conventional designed circuit pattern (100) with a designed circuit pattern (10). That is, according to the method of designing a pattern of the first embodiment, conventional square contact holes (11A, 11B, 12A, 12B, 13A and 13B) are replaced with rectangular contact holes (11, 12 and 13), respectively. In particular, such a plurality of contact holes as are finally electrically short-circuited so as to provide an equivalent potential to each other are replaced with a contact hole having a single rectangular pattern. For example, the contact holes (11A and 11B) are replaced with the rectangular contact hole (11). A plurality of contact holes having an equivalent potential in the form of a square pattern are replaced with a single contact hole in the form of a rectangular pattern, and thus there is electrically no problem. Furthermore, according to this replacement, an opening area of a contact hole is broadened, and thus a reliable electrical connection can be secured in a similar manner to the one when a plurality of contact holes is provided.

Besides, a plurality of rectangular contact holes (11, 12 and 13) are arranged in such a manner that a long side of each of the rectangular patterns is adjacent to that of another rectangular pattern, and the position of the upper and lower ends of each of the long sides is trued up. Furthermore, according to such an arrangement of rectangular patterns, as mentioned hereinafter, a space between the opening patterns (21, 22 and 23) of the contact holes on the photomask pattern (20) can be reduced. At the same time, a space between the contact holes (11, 12 and 13) in the designed circuit pattern (10) also can be reduced, and thus the whole area of the circuit pattern also can be reduced.

According to this change in a designed circuit pattern, the conventional photomask pattern (200) also is changed into the photomask pattern (20) of the first embodiment. First, the square opening patterns (21A, 21B, 22A, 22B, 23A and 23B) on the photomask are changed into the rectangular opening patterns (21, 22 and 23), respectively. As compared with the case with the square opening patterns, in case of the rectangular opening patterns, a side lobe is lower in light intensity, and thus a degree of a deformation of a transferred pattern due to a side lobe can be decreased. Accordingly, a space between opening patterns can be further reduced; conventionally, the space has been required by "2f" or more in order to avoid the influence of the side lobe.

Furthermore, the plural rectangular opening patterns on the photomask are arranged in such a manner that a long side of each of the rectangular patterns is opposite to that of another rectangular pattern, and the position of the upper and lower ends of each of the long sides is trued up, and thus the correction of the patterns on the photomask by an OPC as mentioned hereinafter can be relatively easily and precisely carried out. Accordingly, in this case, provided that an OPC processing is carried out, each space (MS) between the opening patterns (21, 22 and 23) on the photomask can be further reduced than such a length (MD1) as is not influenced by an Optical Proximity Effect. As a result, each pattern space can be reduced, for example, to "f". Incidentally, to final patterns on the photomask, an OPC processing is added. By reducing the pattern space on the photomask, each space between the contact holes (11, 12 and 13) in the designed circuit pattern (10) can be reduced.

Therefore, according to the method of designing a pattern according to the first embodiment of the present invention, a transferred pattern can be formed on a wafer in accordance with a designed pattern. Furthermore, a pattern area on the wafer can be further reduced.

The size of a pattern on the wafer is not particularly limited; however, as a rectangular contact hole opening on the photomask, it is desired to form into at least such a shape that a deformation of a transferred pattern due to a side lobe can be controlled. Therefore, for example, when the length of a short side is "f", that of a long side is desirably in the range of "1.2f to 4f". For example, when the length of a short side is in the range of 150 nm to 200 nm, the method of designing a pattern according to the first embodiment of the present invention is effective.

(Second Embodiment)

Figure 2:
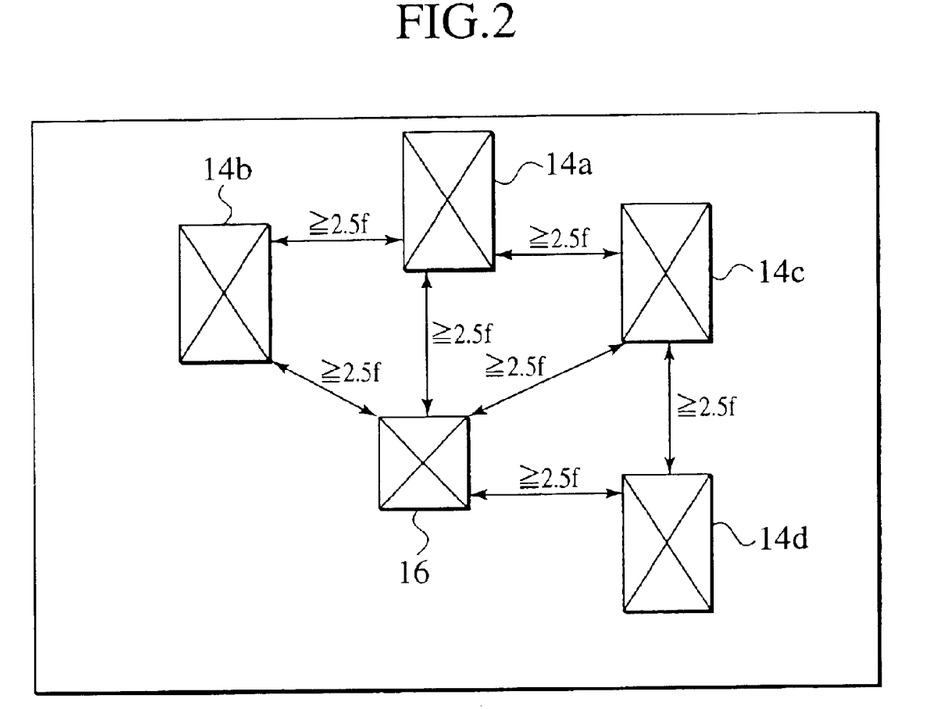
FIG. 2 shows partial patterns on a photomask, as formed according to a method of designing a contact hole pattern according to a second embodiment of the present invention.

FIG. 2 shows a part of patterns on a photomask according to a method of designing a pattern of a second embodiment of the present invention. Designed circuit patterns also have patterns similar to these patterns. In FIG. 2 as well as in FIG. 1, in order to explain the same, the length of one side of a square pattern and the length of a short side of a rectangular pattern are represented by the symbol "f", while a long side of rectangular pattern is represented by the symbol "2f".

As shown in FIG. 2, according to the method of designing a pattern of the second embodiment, when a plurality of contact holes (14a, 14b, 14c and 14d) in the form of rectangular patterns and an opening pattern (16) of a contact hole in the form of a square pattern are scatteringly dispersed on the same photomask, and the position of the ends of the sides of the patterns is not trued up, spaces (MS) between each pattern and other patterns adjacent thereto are determined to such a length (MD2) that a deformation of a transferred pattern due to a side lobe and/or a deformation due to an Optical Proximity Effect are not caused, and a pattern on the photomask can be substantially transferred on a wafer.

When opening patterns are scatteringly dispersed as mentioned above, it is difficult to carry out a precise pattern correction for patterns on a photomask by an OPC processing, and thus each space (MS) between the patterns is previously determined in such a manner that a deformation of a transferred pattern is not caused by an Optical Proximity Effect. Thereby, designed patterns are precisely transferred on a wafer.

Such a length (MD2) that a deformation of a transferred pattern due to a side lobe and/or a deformation due to an Optical Proximity Effect are not caused, and a pattern on the photomask can be substantially transferred on a wafer is found from such a value that no variation in size is caused by an Optical Proximity Effect from adjacent patterns through light simulations and/or experiments. For example, the expression "2.5f or more" is shown in FIG. 2; however, the length (MD2) is not limited to this value. For example, a value of 1.2f to 3f or more can be employed.

On the other hand, when there is not the influence of a side lobe, and an OPC processing can be easily and precisely carried out for a deformation by an Optical Proximity Effect, for example, when the position of the ends of the sides of adjacent patterns is trued up, such as the rectangular opening patterns (21, 22 and 23) in the photomask (20) as shown in FIG. 1, provided that an OPC processing is applied to the portions, each space (MS) between patterns is made than such a length (MD1) that an Optical Proximity Effect is not caused.

As mentioned above, according to the method of designing patterns of the second embodiment, when a plurality of rectangular opening patterns for contact holes, and a single or plural square opening pattern(s) for a contact hole(s) are present together, each space (MS) between the patterns is determined to such a length that a precise pattern transcription can be provided, depending to the shape of two patterns adjacent to each other and the relation of arrangement thereof.

Figure 3:
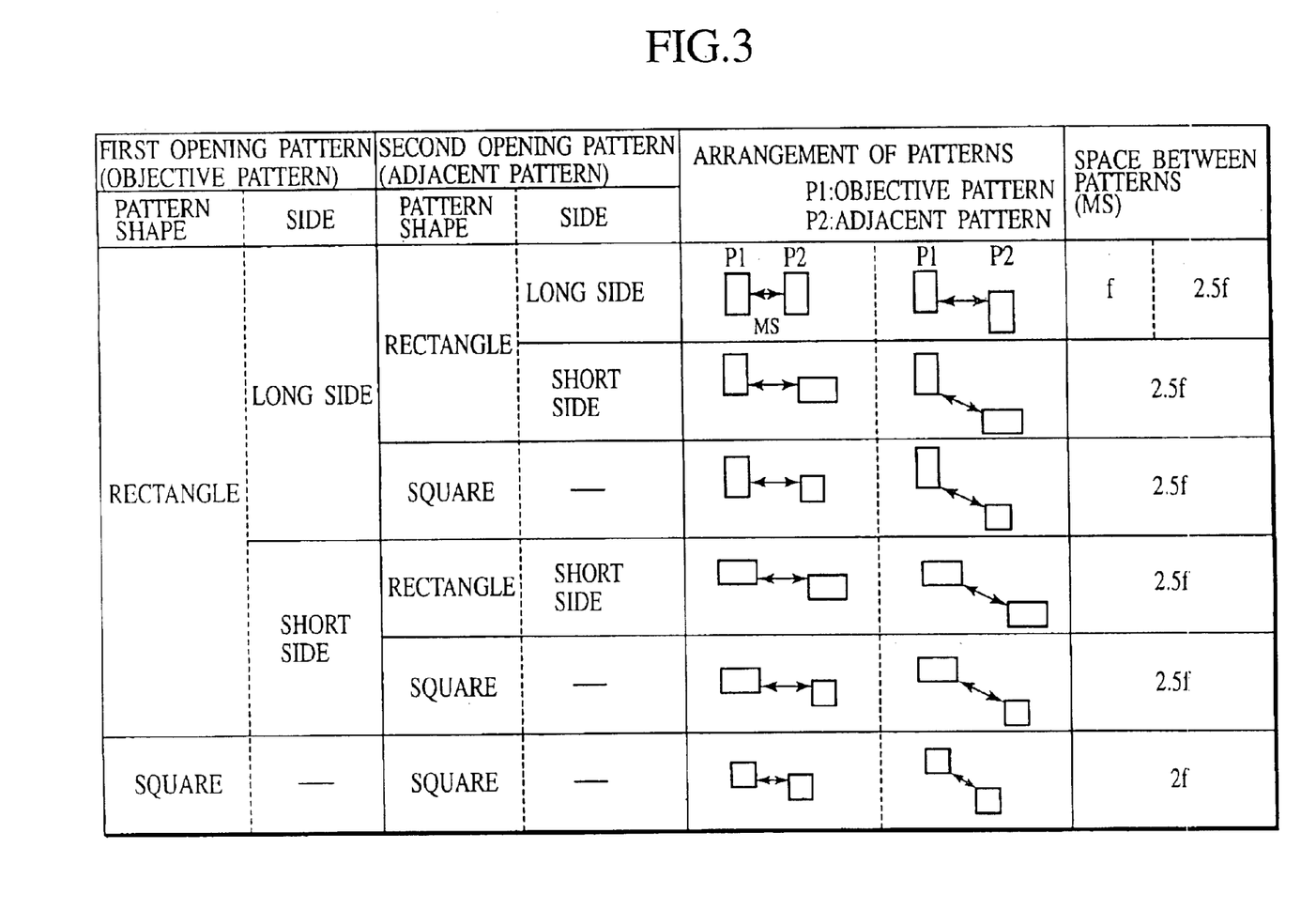
FIG. 3 is a table showing a correlation between the shape of an adjacent pattern as formed by the method of designing contact hole patterns according to the second embodiment of the present invention, and a space between the patterns thereof.

FIG. 3 is a table showing a space between patterns to be established depending to the shape of two patterns adjacent to each other and the condition of arrangement thereof, according to the method of designing contact hole patterns of the second embodiment. In the table of FIG. 3, as well as in the above-mentioned example, the length of one side of a square pattern or the length of a short side of a rectangular pattern is represented by the symbol "f", while the length of a long side of the rectangular pattern is represented by the symbol "2f".

As shown in the table, for example, when a first rectangular pattern (as an objective pattern) is adjacent to a second rectangular pattern (as an adjacent pattern), and a long side of the first rectangular pattern is opposite to a long side of the second rectangular pattern, and the position of the ends of the long sides is trued up, an OPC processing can be applied to a photomask pattern therefor, and thus a space (MS) between the first rectangular pattern and the second rectangular pattern is established, for example, to "f" which is shorter than such a length (MD1) that an Optical Proximity Effect is caused. However, when the position of the upper ends and the lower ends of the opposite long sides gets out of position, it is difficult to correct the same by an OPC processing, and thus a space (MS) therebetween is established to such a length (MD2) that an OPC processing is not required, for example, to "2.5f" or more.

Furthermore, when a first rectangular pattern (as an objective pattern) is adjacent to a second rectangular pattern (as an adjacent pattern), and a long side of the first rectangular pattern is opposite to a short side of the second rectangular pattern, or when a first rectangular pattern and a second square pattern are arranged so that a long side of the first rectangular pattern is opposite to one side of the second square pattern, a space (MS) between the patterns is established to such a length (MD2) that an OPC processing is not required, for example, to "2.5f" or more.

Besides, when a first square pattern (as an objective pattern) is adjacent to a second square pattern (as an adjacent pattern), it is necessary that a space (MS) between the patterns is established to such a length (MD2) that a deformation of transferred patterns is not caused by an Optical Proximity Effect and a side lobe of an exposure light. Accordingly, a space between the first and the second square patterns is established to, for example, "2f" or more. Incidentally, in this case, it is possible to transfer a pattern on a photomask onto a resist without a substantial deformation.

Figure 4:
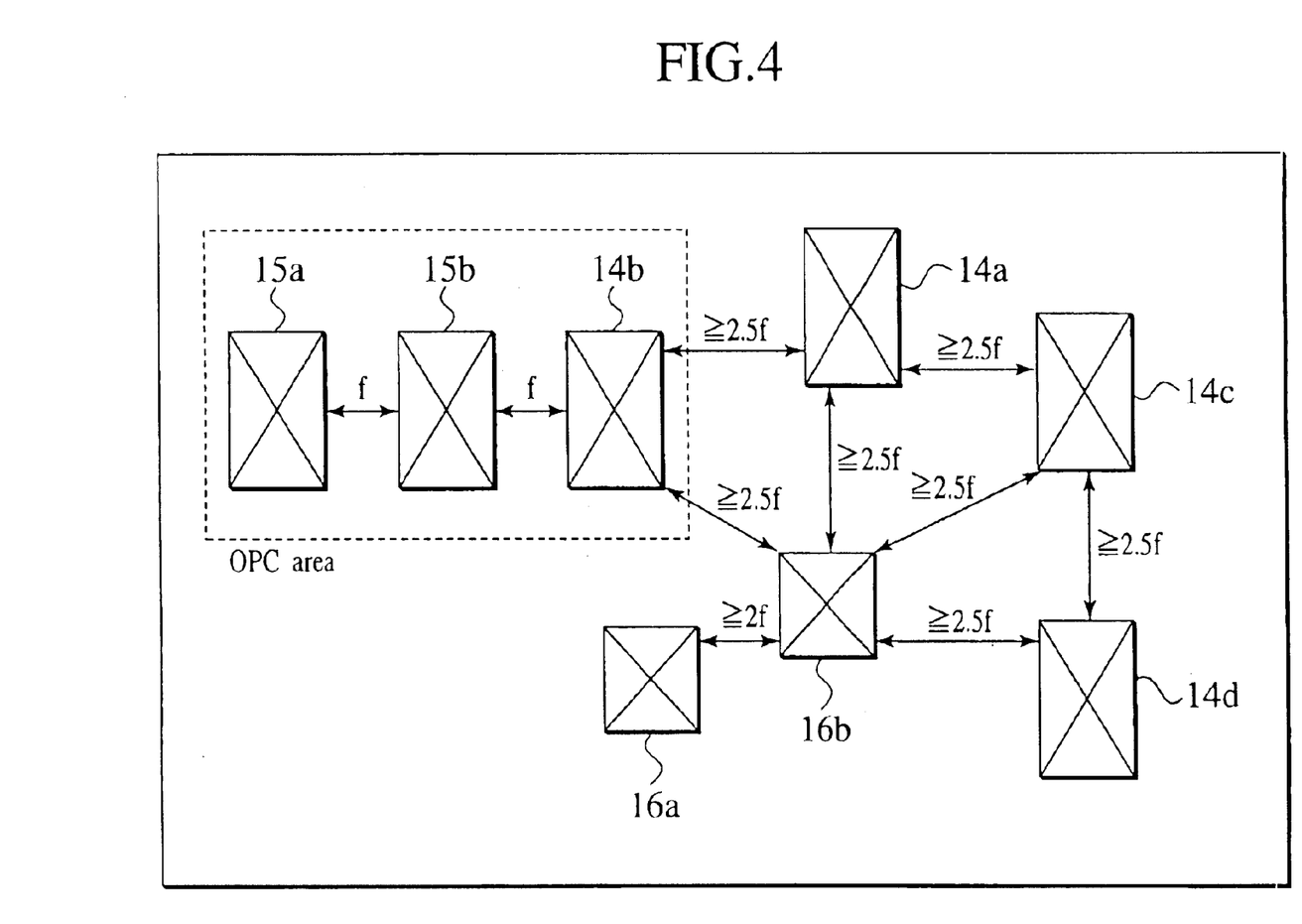
FIG. 4 shows patterns on a photomask, as formed by a method of designing a contact hole pattern according to the second embodiment of the present invention.

FIG. 4 is a drawing illustrating circuit patterns of contact holes, as designed according to the designing method of the second embodiment, on the basis of the table of FIG. 3. Incidentally, in patterns corresponding thereto on a photomask, an OPC processing will be applied to an area corresponding to a broken line portion. Indeed, a pattern of this broken line portion may correspond to a pattern as designed according to the method of designing a pattern, which was explained in the first embodiment of the present invention.

If a photomask as prepared according to the method of designing a pattern of the second embodiment, a transferred pattern in accordance with the size of a designed pattern can be formed on a wafer.

In the above-mentioned explanation, when each of the adjacent patterns is rectangular, such a length (MD1) that no Optical Proximity Effect is caused will be substantially identical with such a length (MD2) that no deformation of a transferred pattern by a side lobe and/or an Optical Proximity Effect is caused.

(Method of OPC Processing)

Figure 5:
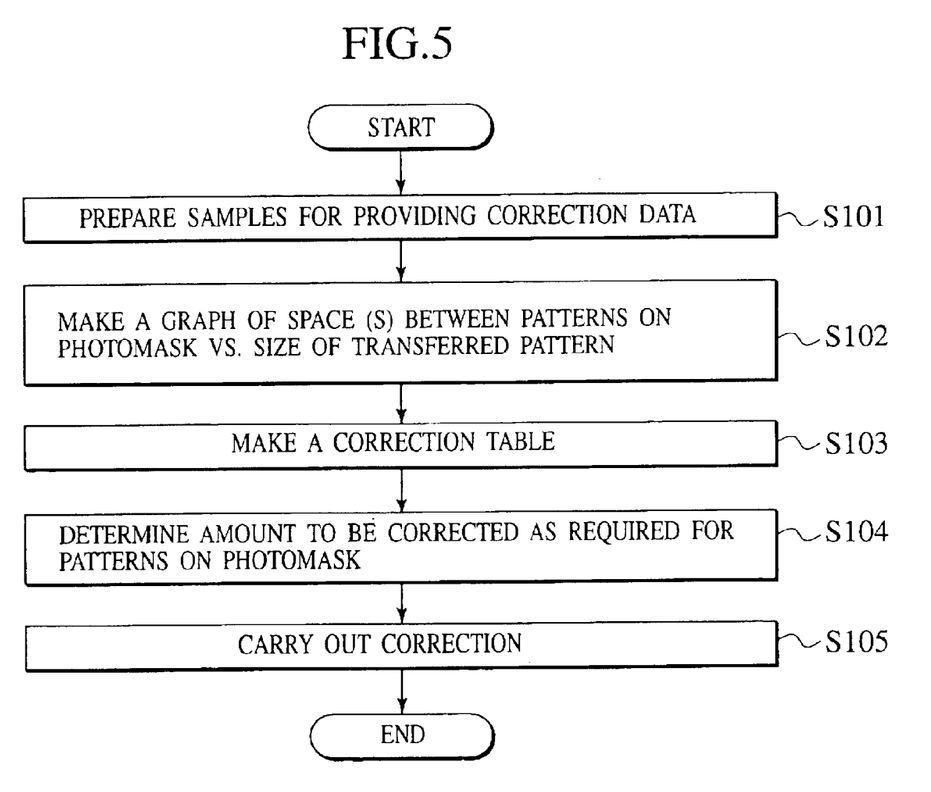
FIG. 5 is a flow chart showing a procedure for an OPC processing according to the second embodiment of the present invention.

A method of correcting a photomask pattern by an OPC processing in connection with the embodiments of the present invention will be explained. FIG. 5 illustrates a procedure for carrying out an OPC processing.

Figure 6:
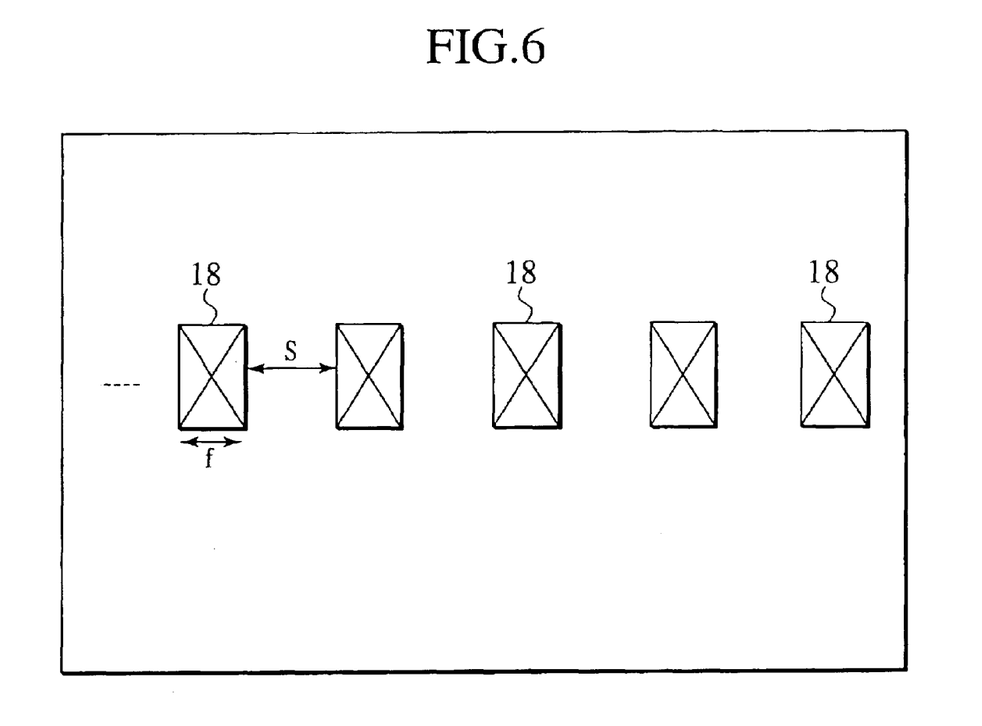
FIG. 6 shows an example of patterns that are intended as an object for an OPC processing in a photomask according to the second embodiment of the present invention.

As shown in FIG. 6, an OPC processing is intended to a plurality of rectangular patterns (18) each of which has a short side "f" and the same size and shape as those of the others, wherein the rectangular patterns (18) are arranged so that the position of the upper ends and the lower ends thereof are trued up. Each space (S) between the patterns is "2.5f" or less. When the space (S) is "2.5f" or more, the influence of an Optical Proximity Effect can be removed, and thus an OPC processing is not required.

Hereinafter, a procedure for an OPC processing as shown in FIG. 5 will be explained.

1) Step 101: First, in the step 101, samples as required for providing correction data are prepared. That is, as shown in FIG. 6, a plurality of rectangular patterns (18) on a photomask are prepared, wherein a short side of each of the rectangular patterns (18) has a length of "f", the rectangular patterns (18) are arranged in such a manner that a long side thereof are opposite to that of an adjacent rectangular pattern (18), and each space (S) between the patterns is changed in the range of "f" to "2.5f". Then, a photolithography process is practically carried out so as to produce samples in which each of the patterns is transferred on a resist.

Figure 7:
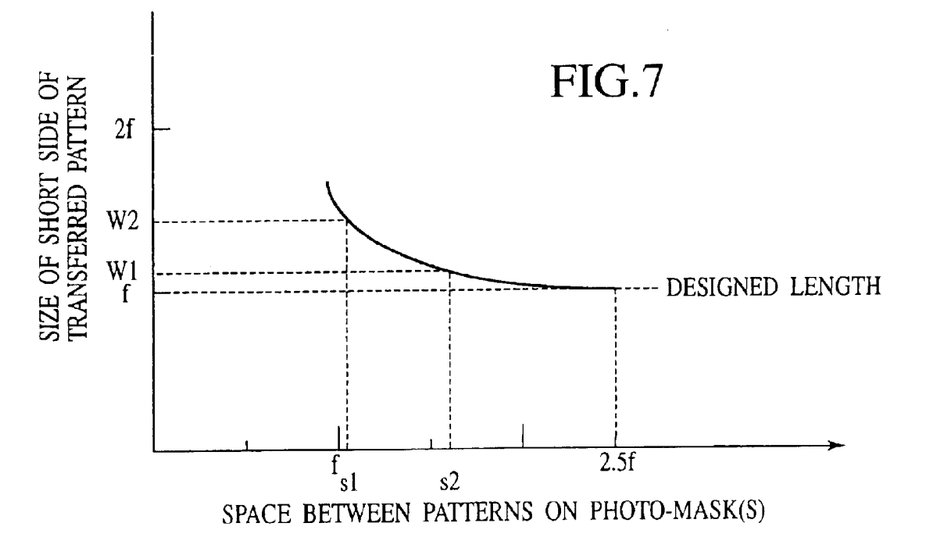
FIG. 7 is an example of a graph as made out at the step "S102" of the flow chart as shown in FIG. 5.

2) Step 102: The size of patterns as transferred on the samples as prepared in the step 101 is measured. Then, as shown in FIG. 7, a graph in which sizes (W) of transferred patterns as formed on samples to spaces (S) between patterns on the photomask are plotted. The graph as here shown illustrates an example of sizes of short sides of transferred rectangular patterns. As can be clarified from this graph, when a space (S) between patterns is "2.5f" or more, the designed size "f" on the photomask corresponds to the size of transferred pattern on the resist, while when space (S) is shorter than "2.5f", the size of transferred pattern is broader than the designed size due to an Optical Proximity Effect.

For example, when a space (S) is "s2", a size of a transferred pattern comes to be "W1". Therefore, the difference (W1–f) between the same and a designed size "f" is a required amount to be corrected. When a space (S) is "s1", the difference (W2–f) is a required amount to be corrected. In connection with the size of a long side of a rectangular pattern, a graph similar thereto is prepared.

Figure 8:
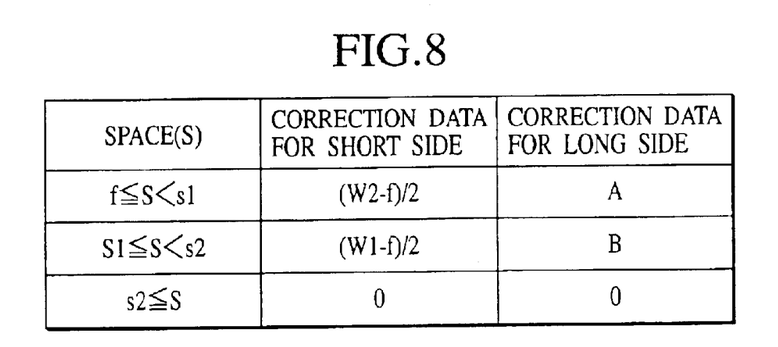
FIG. 8 is an example of a correction table as made out at the step "S103" of the flow chart as shown in FIG. 5.

3) Step 103: Then, as shown in FIG. 8, a correction table is prepared on the basis of a graph as prepared in the step 102. Incidentally, for reasons of an EB (Electron Beam) drawing for a photomask, the minimum unit of the value of an amount to be corrected is such a minimum grid that the mask can be drawn. Furthermore, an amount to be corrected is represented by an amount that is added to one-side end of a short side. Accordingly, as shown in FIG. 8, for example, when a space (S) is "f" or more and "s1" or less, an amount to be corrected for a short side comes to be (W1–f)/2. An amount to be corrected for a long side also is determined from a graph as prepared in the step 102 in a manner similar thereto. Incidentally, hereupon, a space between a pattern and an adjacent pattern in the direction of a long side is sufficiently separated, and thus an amount to be corrected is small as compared with an amount to be corrected as required for a short side. For example, hereupon, when a space (S) is "f" or more and "s1" or less, an amount to be corrected for a long side is "A".

4) Step 104: For a pattern to which an OPC processing is intended, from data for designing patterns on the photomask, an amount to be corrected as required for the size of each of a short side and a long side a pattern on the photomask is determined.

5) Step 105: Data concerning patterns on the photomask are corrected on the basis of an amount to be corrected as determined in the step 104 so as to provide a final data concerning the patterns on the photomask.

As mentioned above, an OPC processing is applied to a part of data on patterns the photomask. Thereafter, on the basis of data on the patterns, a mask pattern is drawn on the photomask by using an EB (Electron Beam) apparatus, and thus a photomask by which a pattern in accordance with a design can be transferred can be provided.

As explained on the above, by using the method of designing patterns of a semiconductor integrated circuit, and a photomask in connection with the present invention, a designed pattern on a semiconductor device can be precisely formed.

As mentioned above, in embodiments of the present invention, an opening pattern of a contact hole is explained; however, the present invention also can be applied to a method of designing other patterns such as a wiring pattern. Furthermore, an example for using square and rectangular opening patterns is explained; however, some changes may be made in patterns within such a range that an equivalent effect can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of designing patterns of a semiconductor integrated circuit comprising:

replacing at least a pair of first contact holes which have square shaped opening patterns electrically connected to each other with a second contact hole which has a rectangular shaped opening pattern with adjacent sides of different lengths wherein at least a pair of the sides of the second contact hole are longer than sides of the first contact holes.

2. A method of designing patterns of a semiconductor integrated circuit comprising:

forming a plurality of second contact holes which have rectangular shape opening patterns having adjacent sides of different lengths by replacing at least a pair of first contact holes which have square shape opening patterns connected to each other with second contact holes which have rectangular shape opening patterns having adjacent sides of different lengths wherein at least a pair of the sides of the second contact hole are longer than sides of the first contact holes; and arranging the second contact holes in such a manner that a long side of each of the rectangular opening patterns having adjacent sides of different lengths is opposite to a long side of an adjacent rectangular opening pattern having adjacent sides of different lengths, and positions of both ends of the long sides are trued up.

3. The method of designing patterns of a semiconductor integrated circuit according to claim 2, further comprising:

arranging the contact holes having a plurality of rectangular opening patterns having adjacent sides of different lengths in such a manner that each space (DS) between the opening patterns is made shorter than such a length (DD1) that no Optical Proximity Effect is caused to transferred patterns as prepared by using the opening patterns when corresponding opening patterns are formed on a photomask.

4. A method of designing patterns of a semiconductor integrated circuit, comprising;

forming a plurality of second contact holes which have rectangular shape opening patterns having adjacent sides of different lengths by replacing at least a pair of first contact holes which have square shape opening patterns connected to each other with second contact holes which have rectangular shape opening patterns having adjacent sides of different lengths wherein at least a pair of the sides of the second contact hole are longer than sides of the first contact holes, and arranging the contact holes and other plurality of contact holes having rectangular opening pattern having adjacent sides of different lengths or square opening patterns, which are present together in the following manner;

in such an area where the positions of both ends of a side of adjacent opening patterns are not trued up, each space (DS) between the opening patterns is made to be such a length (DD2) that, when the opening patterns corresponding thereto are formed on a photomask, no deformation of transferred patterns formed by using the opening patterns is caused by a side lobe of an exposure light and/or by an Optical Proximity Effect, and in such an area where long sides of the rectangular opening patterns having adjacent sides of different lengths are adjacent to be opposite to each other and the positions of both ends of adjacent long sides are trued up, each space (DS) between the opening patterns is made shorter than such a length (DD1) that, when the opening patterns corresponding thereto are formed on a photomask, an Optical Proximity Effect is not caused to transferred patterns as prepared by using the opening patterns.

5. A photomask for manufacturing a semiconductor device having a semiconductor integrated circuit as designed by the method of claim 2, comprising:

a plurality of rectangular opening patterns having adjacent sides of different lengths for contact holes provided thereon; which are arranged in such a manner that long sides thereof are opposite to each other, and the position of both ends of each long side is trued up.

6. The photomask according to claim 5, wherein each space (MS) between the opening patterns of the plurality of rectangular opening patterns having adjacent sides of different lengths is made shorter than such a length (DD1) that no Optical Proximity Effect is caused to transferred patterns; and an Optical Proximity Effect correction is applied to the opening patterns.

7. A photomask for manufacturing a semiconductor device having a semiconductor integrated circuit as designed by the method of claim 4, comprising:

a plurality of rectangular opening patterns having adjacent sides of different lengths or square opening patterns in which the positions of both ends of sides of an adjacent rectangular opening patterns having adjacent sides of different lengths or square opening patterns are not trued up, and each space (MS) between the opening patterns is made to be such a length (MD2) that no deformation of a transferred pattern is caused by a side lobe due to an exposure light and/or by an Optical Proximity Effect; and a plurality of rectangular opening patterns having adjacent sides of different lengths in which long sides thereof are adjacent to each other and opposite to each other, and the position of both ends of long sides adjacent to each other are trued up, and each space (MS) between the opening patterns is made shorter than such a length (D1) that no Optical Proximity Effect is caused, and to which an Optical Proximity Effect correction is applied.

8. The photomask according to claim 5, wherein the photomask is a half-tone type of phase shift mask.

9. The photomask according to claim 6, wherein the photomask is a half-tone type of phase shift mask.

10. The photomask according to claim 7, wherein the photomask is a half-tone type of phase shift mask.

11. A semiconductor device having a semiconductor integrated circuit which is designed by using the method of claim 1.

12. A semiconductor device having a semiconductor integrated circuit which is designed by using the method of claim 2.

13. A semiconductor device having a semiconductor integrated circuit which is designed by using the method of claim 3.

14. A semiconductor device having a semiconductor integrated circuit which is designed by using the method of claim 4.

* * * * *